(12) United States Patent
Nielsen

(10) Patent No.: US 8,694,295 B2
(45) Date of Patent: Apr. 8, 2014

(54) SYSTEM AND METHOD FOR TIME VIRTUALIZATION IN COMPUTER SYSTEMS

(75) Inventor: Korran Lorne Michael Nielsen, Calgary (CA)

(73) Assignee: Aria Solutions, Inc., Calgary, Alberta (CA)

( * ) Notice: Subject to any disclaimer, the term of this patent is extended or adjusted under 35 U.S.C. 154(b) by 248 days.

(21) Appl. No.: 12/804,750

(22) Filed: Jul. 27, 2010

(65) Prior Publication Data
US 2012/0029901 A1    Feb. 2, 2012

(51) Int. Cl.
G06G 7/48    (2006.01)

(52) U.S. Cl.
USPC .......................................................... 703/6

(58) Field of Classification Search
USPC ........................................................ 703/22, 6
See application file for complete search history.

(56) References Cited

U.S. PATENT DOCUMENTS

| 7,092,866 B2 * | 8/2006 | Rokosz ............................. 703/17 |
| 7,236,486 B2 * | 6/2007 | Baker et al. ..................... 370/352 |
| 7,912,205 B2 * | 3/2011 | Dezonno et al. ......... 379/265.02 |
| 2005/0027500 A1 * | 2/2005 | Cornhill et al. .................. 703/13 |

* cited by examiner

Primary Examiner — Aniss Chad
(74) Attorney, Agent, or Firm — Galvin Patent Law LLC; Brian R. Galvin (57) ABSTRACT

A system and method for time virtualization, comprising a time virtualizer running on a first digital computer and adapted to intercept time-dependent requests from a plurality of applications executing on the first or another digital computer, wherein on intercepting a time-dependent request from an application, the time virtualizer returns an expected result to the requesting application comprising a virtual time rather than a clock time, the virtualized time being established by the time virtualizer and differing from the clock time, is disclosed.

4 Claims, 4 Drawing Sheets

SYSTEM AND METHOD FOR TIME VIRTUALIZATION IN COMPUTER SYSTEMS

BACKGROUND OF THE INVENTION

1. Field of the Invention

The present invention is in the field of computer systems, and more particularly the field of computer software, and particularly simulation modeling software.

2. Discussion of the State of the Art

Many types of complex processes are usefully studied using simulation, as is well-known in the art. For example, market participants often conduct simulations to estimate the likely outcome of particular investment strategies. In physical sciences, simulation is often used to study systems that are not readily susceptible to direct experiment, and it is also often used in the design of large-scale experiments to understand behaviors that are likely to be observed when the systems being designed are actually operated. In this vein, many large-scale simulations were conducted in advance of the initial startup of the Large Hadron Collider at CERN in Geneva. Another area where realistic and detailed simulations are of great value is the operations of large contact centers, or call centers, in which customer service agents take calls from consumers. The modern contact center typically handles many different types of calls, and uses sophisticated routing logic to optimally distribute calls among available agents, based at least in part on the skill sets of each of the agents.

In the art, contact center operations and specifically contact center routing were analyzed primarily using queuing theory, a mathematical body of knowledge developed over the course of the twentieth century. Unfortunately, modern contact centers have become too complex to be modeled accurately using queuing theory, and simulation has emerged as the only viable means of predicting the likely outcome of various call volume, agent availability, and routing scenarios. But study of contact center operations using simulation is made difficult by two key factors. The first is that it is crucially important to be able to run a simulation model (that is, to simulate a contact center's operations), at a speed much faster than real time. That is, it is desirable to simulate a day of operations of a large contact center in well under one hour, so that multiple runs may be conducted and understanding obtained in a reasonable time frame. If it took one day to simulate one day, it would not be feasible to conduct complex "what if" scenarios using simulation. The second problem is that simulation is a specialized applied mathematical technique, and requires skills that are not generally present in modern contact centers staffs. Because of this, what often happens is that external simulation experts are contracted to develop a custom simulation model for a given contact center, often with those same experts conducting the simulations themselves, interpreting the results, and reporting those results back to the contact center's staff. The problem with this approach is that simulation experts are expensive and do not typically have deep contact center domain knowledge, while the staff of the contact center has the requisite knowledge of contact centers but is unfamiliar with simulation techniques and tools.

The first problem is often solved using a technique referred to as discrete event simulation. In this technique, a simulation engine maintains a list, or queue, of upcoming expected events (events including such things as new call arrivals, terminations of existing calls, arrival or departure of agents, and so forth). Each time an event occurs, it is processed and any resulting events are allocated to a time in the future, and then the next event in the queue is executed, "jumping" the model time from the time of the first event to the time of the next event without waiting for actual clock time to get to the time of the next event. In this way, model time is discretized (hence "discrete event simulation"), and the rate of model execution is typically many times faster than clock time or real time. Unfortunately, though, use of discrete event simulation exacerbates the second problem, as discrete event simulation generally requires advanced simulation knowledge and specialized simulation tools.

What would generally be desirable, in order for simulation to become an everyday tool in contact center operations and planning, is a simulation approach that did not require specialized knowledge to run, and that utilizes standard contact center software products in a way that enables contact center staff to run simulations themselves, and to interpret simulation results using familiar tools. For example, a contact center professional might desire to run a "what if" scenario to see what would occur is a certain routing strategy was modified slightly, and particularly it might be desirable to run the model against a previous day's traffic patterns to see what impact (positive or negative) the proposed routing change would have had compared to the actual results. Unfortunately, in the current art this is not possible, because the key applications used in contact centers are time-dependent and make frequent use of the host computer system's internal clock. For example, a routing strategy might take into account an average time to answer for a certain class of calls in making routing decisions; in order to calculate this average time to answer, it must know the actual clock time of each calls' arrival and of the answering of each call (subtracting the second from the first gives one an "answer time", and these can then be averaged over all calls of a certain type to get the desired result). Currently, simulation tools that are designed to use discrete event simulation cannot be used together with off the shelf contact center software such as routing engines, statistics servers, scheduling software, and the like, precisely because these contact center applications are fundamentally dependent on time for their operation, and they would operate incorrectly if run using a discrete event simulation model's model time.

Because of these interlocking problems, simulation is rarely used in contact centers and, when it is used, it is generally used for a short time for a specific problem, because the cost of keeping a custom simulation model up to date as contact center configuration changes (that is, as agents leave and are hired, and as call volume patterns and call routing strategies change, all of which happens on a continuous basis) is simply too exorbitant. Because of this, the most promising approach to understanding the complex dynamics of modern contact centers is effectively precluded from use, with severe economic impact on large contact centers (unfortunately, most large contact centers today are "flying blind", forced to make operational decisions without a firm understanding of their implications.

What is needed is a way to virtualize time, which is to say a way to allow software products that use time in an integral way to run much faster than real time. If time virtualization were accomplished, then for example contact center professionals would be able to run simulation models using commercially available contact center software products running in conjunction with a user-friendly simulation tool, at speeds many times faster than normal clock speed. For example, in one example the inventor has demonstrated running a simulated contact center of 200 agents, using standard routing and statistics software, at more than 200 times real time (that is, an hour is simulated in about 15 seconds). While the example described here pertains to simulation, time virtualization will be beneficial in any situation where it is desirable to run software or hardware that uses time-based functions dependent on a system clock at a speed many times that of the system clock, without the software or hardware application "knowing" it is not talking to a real clock.

SUMMARY OF THE INVENTION

In the same way that software running on a virtual machine does not "know" that it is not running on dedicated hardware, software running in a virtualized time environment is not "aware" that time is compressed. By creating a virtualized time environment the off the shelf software products in use are "unaware" of any change and will operate as if they were operating in real time. This time compression allows an operator to run multiple simulations comparing the results of manipulating different variables in a timely fashion. The real workloads that were handled by the system software can be back tested in the various simulations. Since the operators are familiar with the off the shelf software they run and use every day they can more easily create and understand various simulations and their outcomes.

In order to address the problems associated with running applications (software or hardware applications dependent on system clocks), such as the contact center simulations described above, the inventor provides a system whereby time is virtualized allowing operators in various domains to run simulations themselves using the basic off the shelf software products that their systems are currently running and are familiar with thereby reducing their dependence on specialized tools and expensive specialists.

Time is virtualized by intercepting all requests to an underlying operating system or its core libraries that are time based, and returning results as if the operating system or its libraries were handling them. A time warp daemon process emulates all time based functions of an operating system kernel or low level library. The daemon receives requests from applications and sends back results in the form expected, but generally at a much earlier actual time. For example, when an application sends a "sleep 300" command to wait for 300 milliseconds, it expects to receive an event (a message or datagram) in 300 milliseconds notifying it that the timer has expired and that is time to "wake up" or take the next step in its internal process. Instead of actually waiting for 300 milliseconds, the request is instead intercepted by the time warp daemon process and the event is sent much sooner than 300 milliseconds. Essentially whenever the software processes are waiting for something to happen, the time warp daemon jumps ahead to the next virtual time at which something is expected to happen and immediately sends out the appropriate event to the appropriate process. Each event sent to requesting processes is provided with a time stamp as before, but the time indicated in the time stamp is a virtualized time rather than a system or clock time. The time warp daemon maintains a queue or stack of upcoming time based events and immediately "jumps" to the next event. When new requests are made, a computation of the required response event and its time is made, and the event is stored in the virtualized time event stack or queue. Each time an event is inserted, it is inserted in a timed-sorted fashion such that the top event is the next event or has the earliest time indicated. The result is that after processing any incoming event, the time warp daemon merely pops to the next event, advancing the virtual time clock to the time indicated for that event. It then collects any resulting new events from the target process and inserts this into the appropriate position in the upcoming event stack, based on the time at which the event is supposed to occur. This eliminates all idle time that normally occurs while applications wait for real time to catch up.

Applications use commands such as sleep or date to access time. Since the "sense" of time of applications is based on the use of these low level time based functions, the applications are "unaware" that real time is passing much more quickly than the time they are working with. The use of the time warp daemon processes allows simulated activities to run much faster than real time using off the shelf products. As an example, in a typical call routing scenario, routing operations can take place at as much as 200 times the speed of normal time. This means that 200 seconds of "real time" are simulated in 1 second. Since the applications interacting with the time warp daemon do not realize that time is being compressed (or warped), they behave normally.

The inventor's system and method for time virtualization of this particular embodiment enables rapid simulations of various scenarios to be run on the same "off the shelf" software that operators use for daily operations. The system and method for time virtualization may be utilized in any number of additional embodiments where it is beneficial to "virtualize" time.

DETAILED DESCRIPTION

Figure 1:
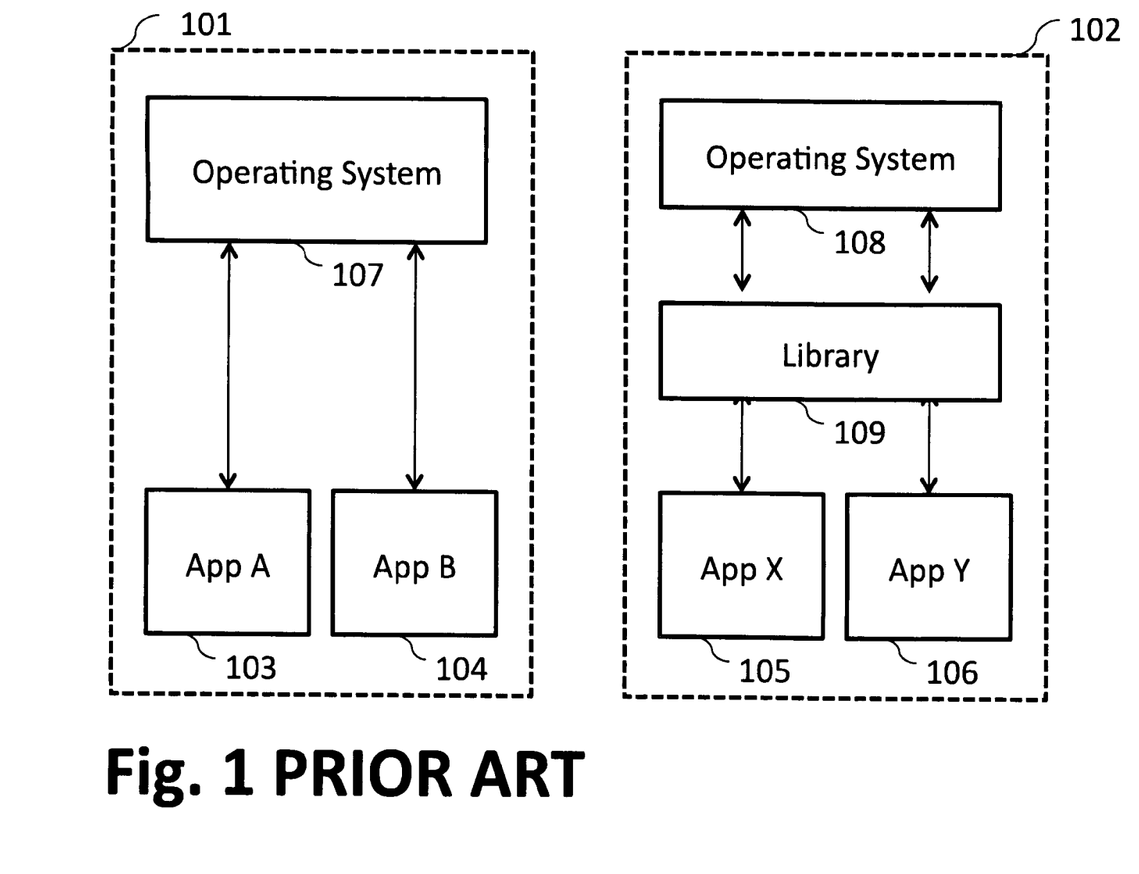
FIG. 1 is a block diagram of two servers illustrating an example of prior art whereby higher level applications communicate with an operating system.

FIG. 1 provides an exemplary illustration of prior art systems and methods in which time-dependent functions are used. Applications, whether specialized software applications running on a general-purpose computer, dedicated applications running on a specialized computer system, or an application embedded as circuitry in silicon, often require access to a reliable system clock to conduct their work. For example, in computer 101, applications A 103 and B 104 may require access to a system clock in order to calculate rates (how much something happens, changes, or moves per unit time), intervals (how long between event 1 and event 2), and scheduled event sequences (for example, let me know when 60 milliseconds have passed, so I can execute a timeout function). In order to use time as a variable, often applications will make function calls against built-in operating system 107 functions. In essentially all digital and analog computers, an underlying operating system 107 (also 108 in a second example) is used to manage low-level system functions, one of which is a system clock (usually, but not necessarily, implemented as a piece of dedicated low-level code within operating system 107, 108 that takes advantage of the central processing unit's hard-wired clock functions). Examples of operating systems include various flavors of Unix™, Linux™, Windows™, Mac OS™, although there are many other less well-known operating systems, including operating systems that are embedded in silicon (that is, that do not rely on any separable software but are built into circuitry directly). All operating systems have built-in system clocks and a set of time-dependent functions that may be called by applications 103-106 running within, or "on", the operating system. For the purposes of this application, "operating system" is not limited to any particular commercial operating system such as Windows™ and, all illustrations being exemplary in nature, nothing in this application should be construed as limiting the application of the invention to any applications running on any operating system.

Further, in some cases applications, such as application X 105 and application Y 106, run on a computer 102 that operates under control of an operating system 108, but do not directly invoke operating system 108 functions for time-dependent functions, but rather rely on some other low-level library 109 for access to these functions. For example, some time-dependent functions are contained in a standard C library referred to in the art as libc. Functions such as date( ), sleep( ), and the like can be called by programs written in C (or programs written in languages that use libc, such as interpreted languages like Perl). In these cases, applications 107-108 in the art make calls to libc that are then passed as needed to the underlying operating system 108 as needed in a way that is not visible or useful to the requesting application 105-106. There are many arrangements such as that illustrated in the right side of FIG. 1, including those that involve use of the Java language; in these cases the identity of library 109 will depend on the language and computer architecture chosen. Additionally, in some cases applications 103-106 use a mixed mode for handling time-dependent calls (that is, "function calls"), sometimes going directly to the operating system 107-108 and sometimes going through an intermediate library 109; it will be appreciated by one having ordinary skill the art of computer architectures and computer programming that there are many ways in which applications can access time-dependent functions in order to carry out their instructions, all of which depend on a "real time system clock", that is, a clock which is synchronized with actual clock time for the location in which the computer is operating (although many computer systems ignore time zones and operate instead using universal computer time, we need not consider time zone effects at all for the purposes of this application, as the issue herein pertains to time virtualization, or more specifically an intentional change in a time scale used within affected applications such that time passes "for the application" more or less quickly than it does in real time (i.e., for a real observer), without the application's "being aware" of the change and, importantly, without requiring the application to be changed in any way (while such time warping will normally be done to "speed up time", time virtualization systems and methods according to the present invention can as easily cause virtual time to pass more slowly than real time within an application.

A key aspect of the present invention is the interception of time-dependent function or method calls to an operating system 107, 108 or library 109. In a preferred embodiment of the invention illustrated in FIG. 2, computers 201, 202 operate analogously to those in FIG. 1, except time-dependent function or method calls to operating systems 207, 208 or library 211 are intercepted by a time warp daemon 209, 210. That is, time-dependent function or method calls that would normally have been sent to an operating system 207, 208 or a library 211 such as libc are instead redirected to a time warp daemon 209, 210. There are many ways in which such a redirection can be accomplished. According to an embodiment of the invention, time-dependent function or method calls are redirected using a principle referred to in the art as dynamic linking. "Linking" is a function that links functions or methods stored in separate files or libraries to a particular executable application. In many cases, applications are linked with desired libraries and functions, using static linking, at compile time. But in other cases, linking is performed dynamically at run time. An advantage to dynamic linking is that it generally allows common libraries and functions to be maintained once, even if they are used by many applications. For example, in Windows™-based computers, many functions or methods are deployed as dynamic-loaded libraries or "DLLs", allowing updates to be made to them without requiring recompilation of programs that depend on them. Another method of dynamic linking, common on UNIX™ and Linux™-based machines, is through use of a built-in dynamic loader, which is configured via environment variables such as LD_PRELOAD. It will be appreciated by those having ordinary skill in the art of modern computer programming that there are many methods, including others not based on dynamic linking, for "intercepting" a function call directed to one library and instead handling it with a different library.

In a preferred embodiment of the invention, a dynamic linker is configured using a LD_PRELOAD environment variable to redirect all calls to libc to a time warp daemon 209, 210, so that all time-dependent functions accessed by programs will run through time warp daemon 209, 210 instead of a standard libc library (which normally is very closely tied to the system clock). In the embodiment, time-dependent function interception is carried out in user space, and affects only applications running within an affected user space. In some embodiments, other libraries or a plurality of libraries containing time-dependent functions or methods are handled via analogous redirection; for instance, calls to glibc may be intercepted instead of, or in addition to, calls to libc, and so on. In yet other embodiments, time warp daemon 209, 210 may be implemented as a kernel-level library and intercept system-level time-dependent calls. Such an approach is advantageous in that it would work with applications that make direct calls to kernel-level time-dependent functions instead of or in addition to calls to user space libraries 211 such as libc or glibc, but require kernel-level patching and is therefore not always necessary or desirable for a particular purpose. For example, in order to support time-warped simulation involving unmodified third-party applications (such as applications A 203, B 204, X 205, or Y 206 in FIG. 2), it is often adequate to intercept user space time-dependent functions via library 211 rather than intercepting calls going to system space functions resident in operating system 207, since applications 203-206 generally execute in user space and would thus be aware only of time as exposed via library 211.

Figure 2:
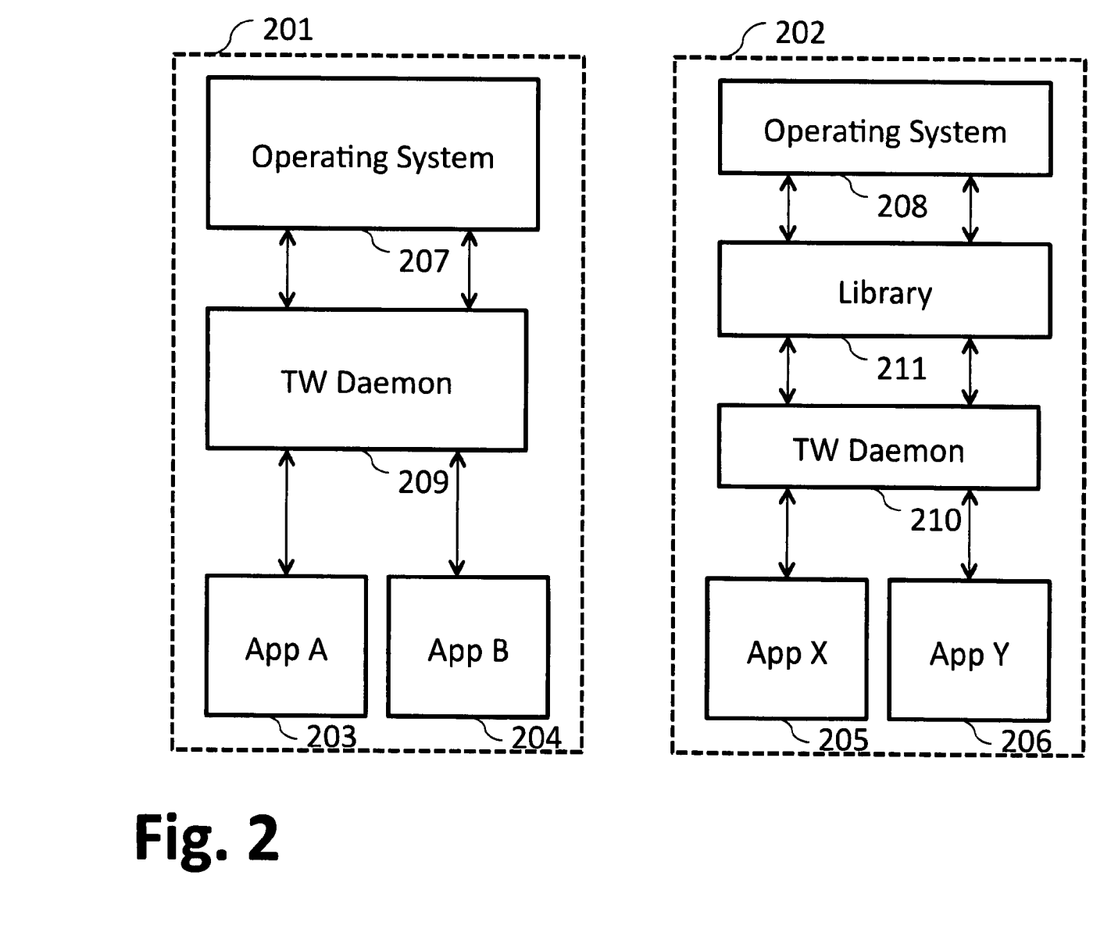
FIG. 2 is a block diagram of an embodiment of the invention incorporating a time warp daemon process in the server.

In some embodiments, an entire machine may be run on virtualized time using a system or method according to the invention. For instance, if computer 201 runs operating system 207 and all time-dependent functions from applications 203-204 are intercepted by time warp daemon 209, then in effect time warp daemon 209 will provide a virtualized time to all functions running on computer 201. This may be advantageous, as time virtualization will effectively maximize utilization of computing resources on computer 201. A limitation of such system-wide time virtualization is that, if the system interacts in real time with other systems, and clock time is an important aspect of interactions between the system and other non-time-warped (or differently time-warped) systems, then time warping would be disadvantageous (as the systems could lead to unexpected and inaccurate results. However, simulation is only one example of a process type where virtualizing time would be advantageous. Other examples would be systems which normally experience light loading but on occasion experience heavy peaks in load, and which interact with other systems asynchronously and without actual clock time's being an important parameter (in such systems, time virtualization would allow the machine to run at full utilization always, with virtual time speeding up and slowing down—as described in detail below—based on changes in processing load).

In various embodiments time warp daemon 209, 210 intercepts calls to time-dependent functions or methods from an application software 203-206 and then provides an expected response back to the specific application 203-206. Time warp daemon 209,210 emulates all time-based functions of an operating system kernel or low level library and independently determines a response time to include in its response, rather than using an actual operating system 207,208 system time or clock time.

For example, assume application Y 206 under normal circumstances sends a call to operating system 208 signaling that application Y 206 wants to "sleep" or "time out" for 300 milliseconds. Time warp daemon 210 however intercepts the call and sends a timer event back to application 206 just as soon as it is the next event in a queue maintained internally by time warp daemon 210. Typically this event would be sent only a few milliseconds after a "sleep for 300 milliseconds" (i.e., sleep(300)) request was sent, thus "warping" or "virtualizing" time.

In an embodiment time warp daemon 209, 210 maintains an internal queue of upcoming events and a "virtualized time" at which each is expected to occur. Each event is added to the internal queue pre-sorted so that the internal queue is ordered based on upcoming event times. For example, when inserting a new event, time warp daemon 209,210 uses one of a variety of well-established sorting algorithms to insert the new event into a queue of upcoming events in a position such that all events of lower index (that is, ordinal position in the queue) than the new event have earlier virtual times at which they will occur, and such that all events of higher index than the new event have later virtual times at which they will occur. There are numerous algorithms for such incremental sorting that are well-known in the art, any of which can be used for the purposes of maintaining an ordered upcoming event queue without departing from the scope of the invention.

According to an embodiment of the invention, when an event occurs (either because it was scheduled to occur—by being the next entry in the upcoming events queue—or when an event occurs asynchronously, which mechanism is discussed further below), the event is dispatched to the appropriate application by a time warp daemon 209, 210, and the event is "tagged" or identified with a virtual time essentially corresponding to the virtual time stored in the upcoming events queue (or included within an asynchronous event when it arrived). Because the only times sent to applications 203-206 are virtual times associated with those events, applications 203-206 are "unaware" that they are operating on virtual time rather than clock time. Unaware here means that the application has no means of determining any actual clock time, since all time-dependent functions and methods are intercepted by a time warp daemon 209, 210 and are handled using virtual time. Thus, importantly, applications 203-206 are able to run faster or slower than real time or clock time without having to make any adjustments in their internal operations. Because of this feature of time virtualization, off-the-shelf applications that depend on time (such as applications that use rates as internal variables) can be run at "fast speed" using virtual time without any necessity to recode the applications, or to reinterpret results afterward (this refers to an approach where one might run an off-the-shelf, time-dependent application faster than real time, then reinterpret the results by compensating for the inaccuracy of time after the fact, which can only be done when such inaccuracies are well-defined and isolable from other effects, which is rarely the case).

In another embodiment of the invention, rather than maintaining a queue of upcoming events, time warp daemon 209, 210 maintains a list of threads, storing for each sleeping thread a time at which the sleeping thread is scheduled to be woken (additionally, threads might be awoken by socket activity, as described herein). When all threads monitored by time warp daemon 209, 210 are sleeping, time warp daemon advances virtual time to the earliest of the scheduled wake up times associated with threads, and wakes up the thread associated with that earliest scheduled time to wake up. In some embodiments, a plurality of applications operate using virtual time, under supervision of a time warp daemon 209, 210, and in these embodiments all time-virtualized applications can share a common virtual time and interoperate without any of the applications' being aware that the common time being used is not, in fact, a system time or clock time.

In another embodiment of the invention, time virtualization is carried out directly by a computer's operating system, such that all time on the system is virtualized. In some embodiments, a binary tree is used for storing upcoming events or for storing thread information, rather than an ordered list. It should be understood that there are many ways to store this time information that are well-known in the art, some of which are more optimized for speed of execution (such as binary trees), and some of which are more optimal for easy coding and maintenance (such as ordered lists), and any of these may be used according to the invention.

Another benefit of running applications in virtualized time is that doing so provides another approach to optimally using information technology resources. Some applications are required to deal with computing loads that are highly variable; for example, contact center call routing engines experience computing intensities that are very highly dependent on arriving call volumes, and these call volumes in turn tend to vary from very low late at night to very high in mid-day periods, for typical contact centers. In previous times, such systems, typically servers, would be operated at much less than full capacity in order to allow such a system to surge when demand picked up without exceeding available resources. For several years, two main approaches have been used to address this problem. One is to distribute resources over multiple physical machines, for instance by using cluster architectures in which, for example, requests to a single internet protocol (IP) address are distributed across a cluster of servers which collectively act as a distributed computer. This approach has challenges with state and data management because state or data changes in one of the clustered servers may need to be propagated to others; an approach to mitigating this problem has been to rely on formally stateless application designs. A second approach to delivering optimal computing resource utilization for applications or systems in which demand varies widely is to use physical virtualization (which is distinct from time virtualization, which is the object of the present invention). Physical virtualization allows many virtual machines to be operated on a single large-scale, general-purpose computer, with each using only the resources it needs. In such systems, it is possible to place a high-priority application with a widely-varying demand profile on a virtual machine that is coresident (operates on the same physical machine as) a virtual machine that executes some less-demanding application (or one of lower priority), so that when the first application experiences a sudden increase in demand, it is able to pull resources away from the lower priority process in order to "expand" the virtual machine's resources for the first application. This approach is quite flexible and, when combined with the first approach (that is, when using the second approach on a clustered server which acts as a large distributed computer hosting multiple virtual machines), can handle demand swings of large magnitude while maintaining a high level of resource utilization.

In contrast to the methods of resource management known in the art and just described, time virtualization according to embodiments of the invention allow a far simpler approach to be used, when appropriate applications are involved. Appropriate applications are those, such as large-scale simulation but not limited to simulation, where resource demand varies greatly over real time, time-based computation is needed, but the application does not need a close tie between system time and real time. That is, time virtualization is an excellent approach to resource optimization when resource demands vary greatly over real time or clock time, but when there is no need to interact dynamically (in real time) with devices or other applications that are directly tied to an actual physical or clock time. For example, an application that analyzes data that has already been collected, and that experiences extreme variations in resource requirements based on the content of the data (for instance, when encountering a large table of data, and where requests to a separate application are made that depend in some way on table size, a sudden increase in CPU power may be needed, whereas for most smaller tables far less power is needed). In normal systems, if the main application or application to which requests are sent computes rates or performs other time-based computations (for example, if some computations or resource allocations depend on a computation rate computed in real time), then the situation is analogous to that experienced in large-scale simulations. Such applications can readily be performed in a resource-optimal way in time-virtualized systems, since the rate at which virtual time proceeds will naturally vary as demand varies, such that when demand is extremely high, virtual time may pass slower than clock time, while when demand is very light, virtual time may pass many times faster than real time. Since no clock time is "wasted" in time-virtualized machines (the machine will not need to wait for a timeout or another asynchronous event; it will automatically advance virtual time to the next event, thus maximally utilizing computing resources), with the exception of overhead caused by time virtualization (which generally is quite low), compute power will automatically be fully utilized in such systems.

Figure 3:
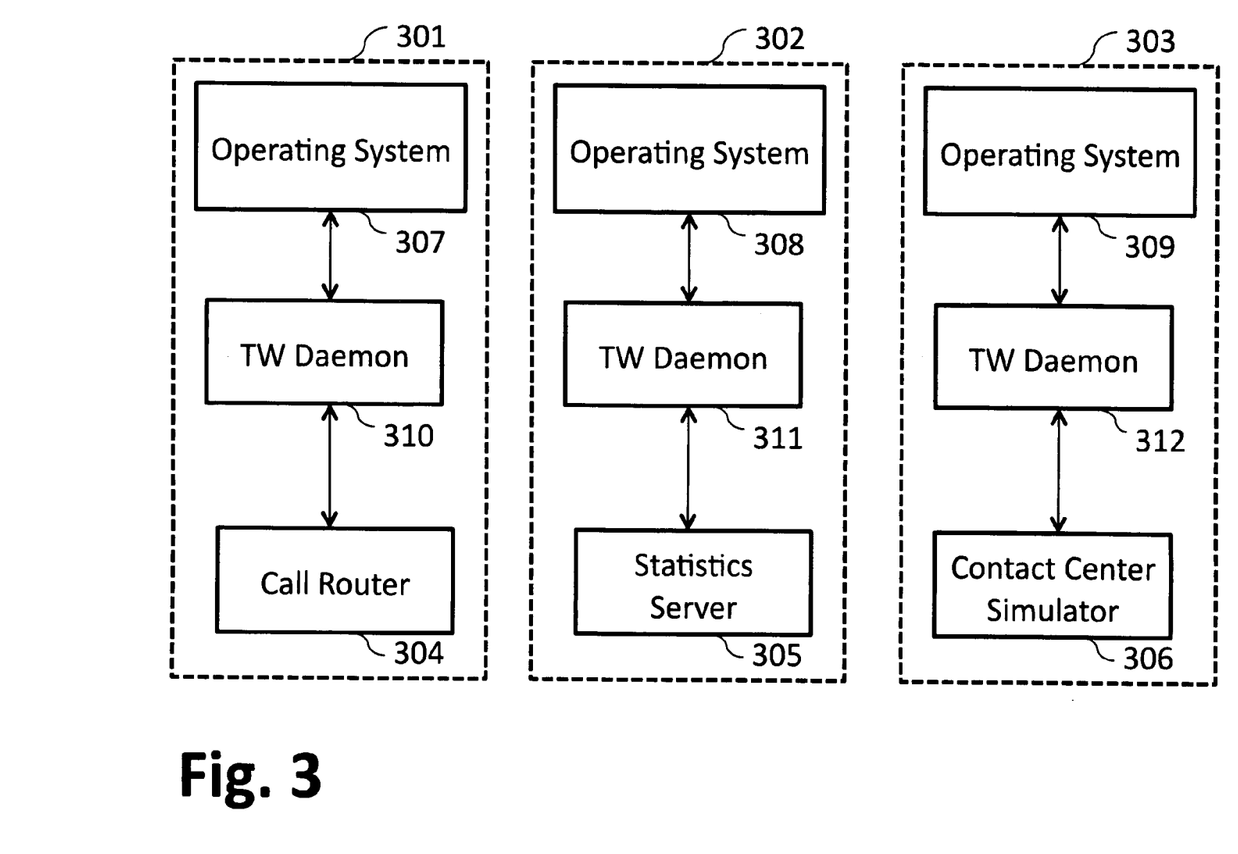
FIG. 3 is a block diagram of an embodiment of the invention illustrating specific applications.

FIG. 3 is a block diagram of an embodiment of the invention illustrating specific applications that may be used by a call center operator (the terms contact center and call center are treated herein as synonymous, and are not limited to centers that handle telephone calls only, but any centers that primarily handle customer interactions). Specific applications are a call router 304, a statistics server 305 and a contact center simulator 306. Each application may run on a separate server 301-303, as illustrated, or the applications may run all on one server, on several clustered servers each, or in any mix; the configuration shown is simply one example among many possible configurations, and should not be treated as limiting the scope of the invention. Call router 304, statistics server 305, and contact center simulation 306 are each adapted to communicate to the other two applications, typically via a packet-based data network such as a local area network (LAN) or a wide area network (WAN). In actual (non-simulated) contact centers, statistics server 305 receives events from systems such as automated call distribution (ACD) systems, for example events such as "call arrived", "call queued", "call established at an agent/customer service representative", "call released", and so forth, and from these events computes a plurality of statistics such as "average call duration", "average call wait time", "percentage of calls abandoned before reaching an agent", and so forth. In typical contact centers, call router 304 is a client of statistics server 305 and uses statistical information received from statistics server 305 to make call routing decisions (for example, "if average call waiting time exceeds 45 seconds, route this call to an overflow agent"). In a simulated contact center such as that show, contact center simulator 306 emulates telephony infrastructure and contact center agents, and is the source of events that are tracked by statistic server 305. Additionally, call router 304 receives route request events from contact simulator 306 and applies preprogrammed routing logic, using statistical information received from statistics server 305, to determine which agent (in this case of course, this means "simulated agent") should receive a particular call. Routing decisions are then passed to contact center simulator 306, which then simulates the events that would occur if an actual agent received an actual call, passing each of such events to statistics server 305 for continued computation of relevant statistics.

Each application 304-306 has time-dependent calls to operating systems 307-309 that are intercepted by a time warp daemon 310-312. As in the previous example, a time warp daemon 310-312 within each server 301-303 maintains an internal queue of upcoming events and a "virtualized time" at which each upcoming event is to occur. Each such queue is sorted so that the next event to occur in virtual time will always be on top of the queue or stack, ensuring that all time-based events occur in the right order with a correct "virtual time". After processing any incoming event, time warp daemon 310-312 fires a next expected event off its associated upcoming event queue or stack, and passes it to an appropriate application 304-306 immediately advancing the virtual time clock and collects any new event now processing it into the queue in the appropriate time sorted fashion. By maintaining a queue or stack of upcoming time based events and jumping form one event to the next, all idle time that occurs as applications wait for "real time" to catch up is eliminated.

Where applications 304-306 are not limited by central processing unit (CPU) power, there is a lot of idle time wasted; for instance, a CPU on machine 302 might be idle after updating all requested statistics on receiving an event from contact center simulator 306, until receiving a next event from contact center simulator 306. An embodiment of the invention utilizing time warp daemon 310-312 processes effectively eliminates such wasted time. The specific application (304,305,306) is "unaware" that time is compressed or warped so they behave normally. Time warp daemons 310-312 process allows simulated activities to run much faster by illuminating idle time. The invention allows simulations of large systems to be accomplished by creating this time-virtualized or time-compressed environment. For example, in a typical call routing scenario, routing operations can take place at as much as 200 times as fast as normal, physical, clock time. In other words, 200 seconds of "real time" are simulated in just one second, and this is achieved using off the shelf contact center application software 304,305 which never "realize" that time is being virtualized or compressed.

It should be noted that the arrangement shown in FIG. 3 adds some complexity to time virtualization, since virtual times maintained by time warp daemons 310-312 must be kept synchronized. This arrangement is merely exemplary, and other arrangements are possible, but before discussing them it is helpful to describe how such synchronization can be achieved according to the invention (there are several methods that occur to the inventor, and in fact many synchronization schemes are known in the art). In one approach, a plurality of time warp daemons 310-312 exchange, after each event is processed, a virtual time (expressed typically in universal computer time, that is, as a number of seconds after Jan. 1, 1970 or another reference data known to each of operating systems 307-309), representing the virtual time for each time warp daemon 310-312 at which the next upcoming event in that daemon's upcoming event queue is to occur. Since each time warp daemon 310-312 receives the same set of three "next event times" (one from itself and one from each of the other two), each of the time warp daemons 310-312 can perform a simple algorithm (such as, pick the lowest time, and in case of a tie, take the event from the tied events in a prearranged order based on its source machine) to determine when the next virtual time "stop" is to occur, and the daemon which "owns" this "next event" would immediately process that event. Such an approach is simple, but does add messaging overhead. Alternative approaches, such as maintaining a single upcoming event queue with a basic data locking mechanism to prevent conflicts, can be used. Alternatively, one master time warp daemon (for instance, in a preferred embodiment, one on the machine that runs contact center simulator 306), can be designated, and it can maintain a single upcoming event queue (and by extension, a single virtualized time dimension) that is used by applications 304-306, thus ensuring a synchronized virtual time that is shared by all the applications.

Figure 4:
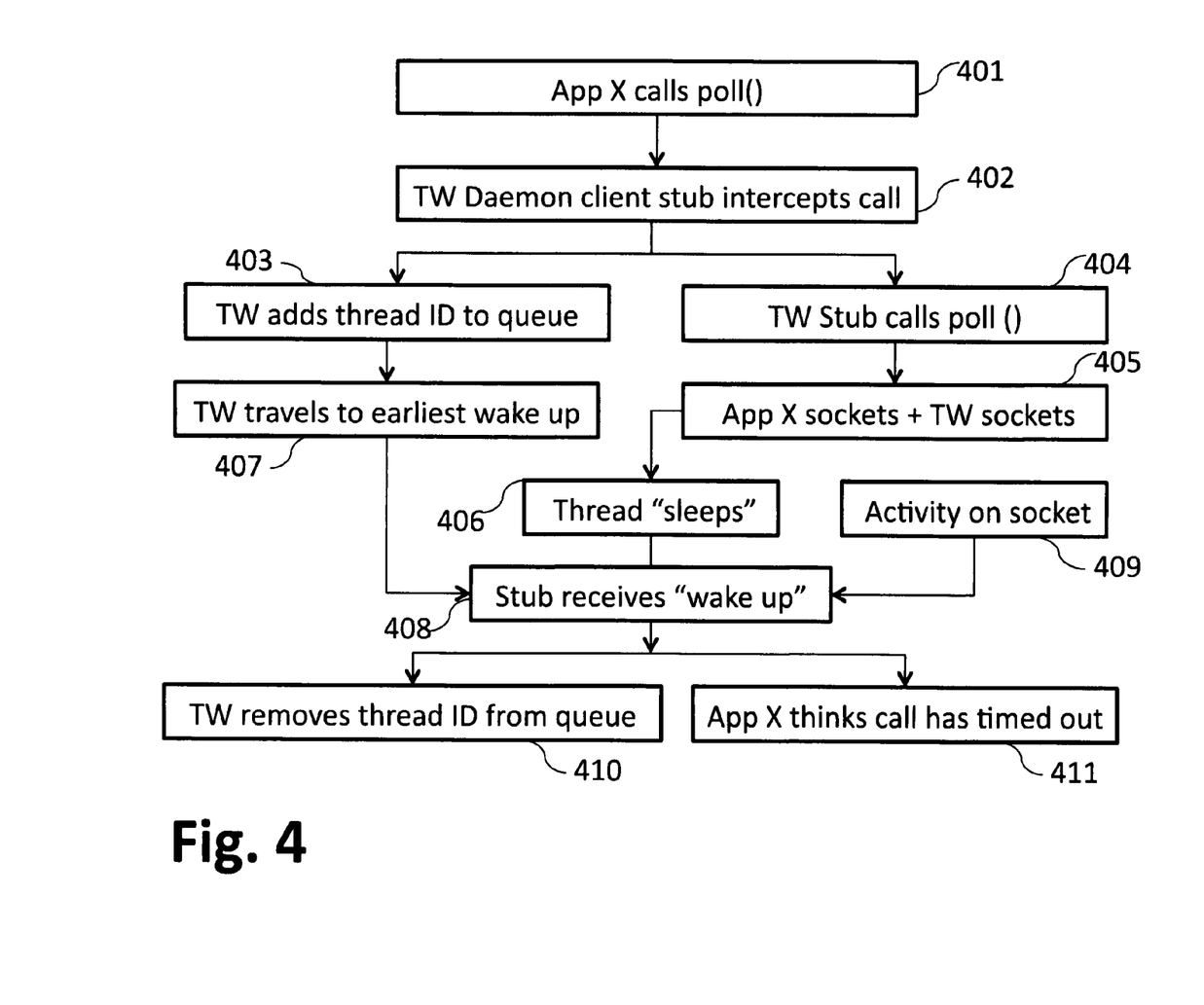
FIG. 4 is a process drawing showing the steps of the process for time virtualization.

FIG. 4 is a process drawing showing steps of a process for time virtualization according to a preferred embodiment of the invention. In the embodiment, a higher-level application such as a stat server calls poll( ) in step 401 to request a timeout on its network sockets. Normally this puts a process to sleep until the requested timeout is reached, or until other data comes into a network socket and wakes up the sleeping process or thread. According to the invention, however, a time warp daemon client stub intercepts this call in step 402 and sends a command to a time warp daemon that it requests a timeout for a certain period of time (or, it wants to sleep for a specified time unless interrupted by activity on a designated socket). A time warp daemon receives the message from the time warp daemon client stub and adds the specific thread identification to its queue of sleeping threads in step 403. In parallel, the time warp daemon stub also calls poll( ) without the timeout in step 404, but with the original sockets associated with application X's request (from step 401) included in the request to poll( ), while also including applicable time warp daemon sockets, in step 405. The original application's thread sleeps, in step 406, waiting for either network traffic from the sockets (provided via notification in step 409), or for a time warp daemon to travel to a next wakeup command in step 408 (which notification is itself in response to the time warp daemon's setting virtual time to the appropriate virtual time based on the first upcoming event in its upcoming event queue in step 407). Note that either an incoming activity on a socket (step 409) or a wakeup event (step 407) from a time warp daemon's upcoming event queue can cause a wakeup call to be received by time warp daemon client stub in step 408, thus allowing simulation to handle asynchronous events in a time warped environment. Also, in some embodiments, as described above, instead of an event queue, a list of threads is maintained, and only when all threads monitored are asleep (waiting for some external event such as a timer event or a socket activity event) will time warp daemon 209, 210 travel to earliest wakeup 407 and wake up the thread associated with the earliest scheduled wakeup time. In these embodiments, as long as at least one monitored thread is active, virtual time will either be maintained stationary or will proceed at the speed of real clock time (either approach may be used according to the invention); once any remaining active threads go to sleep to wait for future events, then step 407 is performed.

Time warp daemons each keep a list or queue of all threads and tracks if each thread is asleep and, if so, when each is scheduled to be awakened. Time warp daemons act immediately after receiving a command from a process. If all registered threads in a queue are sleeping, the time warp daemon essentially "time travels" to the earliest wake-up time (in step 407) of all its managed threads, and sends a message to that thread's socket telling it that it is time to wake up. When the stub receives the wake-up message (in step 408), the call to poll( ) is unblocked and the stub will make the application "think" that it has timed-out (in step 411).

In the scenario where all threads are busy (that is, not sleeping but actually doing something such as computing a statistic, a time warp daemon does nothing. Activity on a socket (in step 409) may wake up a thread independent of a time warp daemon. In this case a time warp daemon client stub then tells its specific time warp daemon that it is awake, and the time warp daemon removes the applicable thread ID from its queue of sleeping threads. This is a synchronous call, so that the time warp daemon client stub can determine its current virtual time and guarantee that no further "time travel" occurs after the response is received. Thus, if an application wakes up due to network activity before control is returned back to the application, a time warp daemon will have stopped time virtualization temporarily and cannot start again until all threads in the system are asleep. Thus a time warp daemon is able to handle asynchronous events while virtualizing time.

In some embodiments, applications don't work directly with events per se; rather, their threads are simply woken up or put to sleep. The events are sent to the time warp stubs, who are asleep waiting for an event from time warp daemon 209, 210 (as well as some application-defined file descriptors in case of some time-based functions such as poll( ) and select( )). As an optimization (to avoid extra context switching when clock_gettime( ) or related functions are called), the stubs (not the application) are told what time it is upon wakeup, but this is not necessary, as they could just ask time warp daemon 209, 210 for the time each time clock_gettime( ) is called.

All of the embodiments disclosed herein are exemplary in nature, and do not limit the scope of the invention, which is defined in the claims.

What is claimed is:

1. A system for virtualizing time in contact center simulation, comprising:
   a first digital computer comprising a time virtualizer software module running on said first digital computer and configured to intercept time-dependent requests to a system library or operating system from a plurality of applications executing on said first digital computer or a second digital computer, the plurality of applications being unmodified to reflect any use of virtual time;
   a contact center routing server software stored and operating on said first or second digital computer; and
   a statistics server software module stored and operated on said first digital computer, said second digital computer or a third digital computer;
   wherein the time virtualizer maintains an event queue of upcoming time-based contact center events, wherein each upcoming contact center event in the event queue comprises at least an event time at which the upcoming contact center event is to take place, and the event queue is arranged with upcoming contact center events sorted in ascending order based on each upcoming contact center event's respective event time;

wherein the time virtualizer inserts new time-based contact center events into the event queue upon receipt of time-dependent requests from the plurality of applications while maintaining the sort order of the event queue;

wherein the time virtualizer and maintains a virtual system time that jumps directly from an event time associated with a first time-based contact center event to a time associated with a second time-based contact center event to advance virtual system time, the first time-based contact center event corresponding to an a contact center event whose handling is completed and the second time-based contact center event corresponding to the event time of the topmost upcoming contact center event in the event queue;

wherein on intercepting a time-dependent request from an application, the time virtualizer returns an expected result to the requesting application comprising a virtual time rather than a clock time, the virtualized time being established by the time virtualizer and differing from the clock time; and further wherein the contact center routing server software and the statistics server software perform simulated contact center operations substantially faster than real-time using virtual times provided by the time virtualizer.

2. A system for virtualizing time in a contact center simulation environment, comprising:

a digital computer;

a call routing application running on said digital computer;

a statistics application running on said digital computer;

a contact center activity simulator application running on said digital computer;

a time virtualizer running on said digital computer wherein the time virtualizer maintains an event queue of upcoming time-based events;

wherein each upcoming event in the event queue comprises at least an event time at which the upcoming event is to take place, and the event queue is arranged with upcoming events sorted in ascending order based on each upcoming event's respective event time;

wherein on intercepting a time-dependent request to a system library or operating system from a plurality of applications executing on said digital computer, the time virtualizer returns an expected result to the requesting application comprising a virtual time rather than a clock time, the virtualized time being established by the time virtualizer and differing from the clock time;

wherein the time virtualizer inserts new time-based events into the event queue upon receipt of time-dependent requests from the plurality of applications while maintaining the sort order of the event queue;

wherein the time virtualizer maintains a virtual system time that jumps directly from a time associated with a first time-based event to a time associated with a second time-based event to advance virtual system time, the first time-based event corresponding to an event whose handling is completed and the second time-based event corresponding to the event time of the topmost upcoming event in the event queue; and further wherein the call routing application and the statistics application perform simulated contact center operations substantially faster than real-time using virtual times provided by the time virtualizer.

3. The system of claim 2, wherein the time virtualizer uses a thread table and advances virtual time whenever all threads in the thread table are idle.

4. A computer-implemented method of virtualizing time in a contact center simulation, comprising the steps of:

sending a time-dependent request from an application to a system library or operating system, the application being unmodified to reflect any use of virtual time;

intercepting the time-dependent request and redirecting it to a time virtualizer, wherein the time virtualizer maintains an event queue of upcoming time-based events, wherein each upcoming event in the event queue comprises at least an event time at which the upcoming event is to take place, and the event queue is arranged with upcoming events sorted in ascending order based on each upcoming event's respective event time;

wherein the time virtualizer inserts new time-based events into the event queue upon receipt of time-dependent requests from the application while maintaining the sort order of the event queue;

wherein the time virtualizer and maintains a virtual system time that jumps directly from a time associated with a first time-based event to a time associated with a second time-based event to advance virtual system time, the first time-based event corresponding to an event whose handling is completed and the second time-based event corresponding to the event time of the topmost upcoming event in the event queue;

returning, from the time virtualizer, an expected response to the request to the requesting application comprising a virtual time rather than a clock time;

wherein the virtual time is established by the time virtualizer and differs from the clock time; and further wherein a contact center routing server software and a statistics server software perform simulated contact center operations substantially faster than real-time using virtual times provided by the time virtualizer.

* * * * *